United States Patent
Manning

(10) Patent No.: US 6,373,755 B1
(45) Date of Patent: Apr. 16, 2002

(54) METHOD AND CIRCUIT FOR LOWERING STANDBY CURRENT IN AN INTEGRATED CIRCUIT

(75) Inventor: H. Montgomery Manning, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/668,043

(22) Filed: Sep. 21, 2000

Related U.S. Application Data

(62) Division of application No. 09/027,111, filed on Feb. 18, 1998, now Pat. No. 6,163,044.

(51) Int. Cl.⁷ .................................................. G11C 7/00
(52) U.S. Cl. .............................. 365/189.09; 365/189.11
(58) Field of Search ........................... 365/189.09, 705, 365/230.06, 226, 189.01

(56) References Cited

U.S. PATENT DOCUMENTS

| | | | |
|---|---|---|---|
| 4,473,758 A | 9/1984 | Huntington | 307/296 |
| 4,556,804 A | 12/1985 | Dewitt | 307/296 |
| 4,686,388 A | 8/1987 | Hafner | 307/296 |
| 4,961,007 A | 10/1990 | Kumanoya et al. | 307/296.2 |
| 5,448,198 A | 9/1995 | Toyoshima et al. | 327/530 |
| 5,461,338 A | 10/1995 | Hirayama et al. | 327/534 |
| 5,528,538 A | 6/1996 | Sakuta et al. | 365/189.09 |
| 5,604,707 A | 2/1997 | Kuge et al. | 365/226 |
| 5,959,444 A | * 9/1999 | Casper | 323/313 |
| 6,026,033 A | * 2/2000 | Casper | 365/189.09 |

FOREIGN PATENT DOCUMENTS

EP      0 714099 A1      1/1994

* cited by examiner

*Primary Examiner*—David Nelms
*Assistant Examiner*—Thong Le
(74) *Attorney, Agent, or Firm*—Dorsey & Whitney LLP

(57) ABSTRACT

An integrated circuit includes a substrate pump circuit developing an internal back-bias voltage on an output, and an external terminal adapted to receive an external back-bias voltage. A semiconductor substrate is coupled to the external terminal and to the output of the substrate pump circuit. The semiconductor substrate includes at least one transistor formed in the semiconductor substrate which has a first threshold voltage when the internal back-bias voltage is applied to the substrate. The at least one transistor has a second threshold voltage greater than the first threshold voltage when the external back-bias voltage is received on the external terminal.

7 Claims, 3 Drawing Sheets

METHOD AND CIRCUIT FOR LOWERING STANDBY CURRENT IN AN INTEGRATED CIRCUIT

CROSS-REFERENCE TO RELATED APPLICATION

This application is a divisional of U.S. patent application Ser. No. 09/027,111, filed Feb. 18, 1998 now U.S. Pat. No. 6,163,044.

TECHNICAL FIELD

The present invention is related generally to semiconductor integrated circuits, and more specifically, to a circuit and method for reducing subthreshold leakage currents of transistors forming an integrated circuit.

BACKGROUND OF THE INVENTION

A typical integrated circuit includes numerous transistors formed in a semiconductor substrate and interconnected to perform desired functions. In many integrated circuits, such as semiconductor memories or microprocessors, the transistors formed in the semiconductor substrate are typically metal oxide semiconductor ("MOS") transistors having source, drain, and gate regions formed in the semiconductor substrate. Each MOS transistor has a threshold voltage $V_T$ corresponding to the gate-source voltage that must be exceeded to turn ON the transistor and allow current flow from the source region to the drain region of the transistor. In an ideal MOS transistor, for gate-to-source voltages less than the threshold voltage $V_T$, no current flows between the source and drain regions. In an actual MOS transistor, however, there is current flow between the source and drain regions when the gate-to-source voltage is less than the threshold voltage $V_T$. This current which flows for gate-to-source voltages less than the threshold voltage $V_T$ is known as the subthreshold leakage current of the transistor.

Due to the subthreshold leakage currents of transistors forming the integrated circuit, a significant amount of power may be consumed by the integrated circuit even when all of the MOS transistors are turned OFF. This is true since millions of transistors may comprise an integrated circuit, and, while the subthreshold leakage current of an individual transistor is negligible, in the aggregate such subthreshold leakage currents can result in significant power consumption.

One way to lower the subthreshold leakage current of a MOS transistor is to increase the threshold voltage $V_T$. By increasing the threshold voltage $V_T$, a smaller subthreshold leakage current flows for a given gate-to-source voltage. The threshold voltage $V_T$ of a MOS transistor can be increased by increasing the magnitude of the voltage applied to the substrate of the transistor, which is known as the back-bias voltage and is typically designated $V_{bb}$. The back-bias voltage $V_{bb}$ is applied to the substrate for proper operation of the MOS transistor as known in the art. Thus, the subthreshold leakage current of the MOS transistor can be decreased by a corresponding increase in the back-bias voltage $V_{bb}$. When the threshold voltage $V_T$ is increased, however, the switching time of the MOS transistor increases accordingly because an input voltage coupled to the gate of the MOS transistor must now reach the higher threshold voltage $V_T$ before the transistor turns ON. In many integrated circuits, such as microprocessors, the threshold voltages $V_T$ must be maintained relatively low to decrease the switching time of the transistors. Thus, although the threshold voltage $V_T$ can be increased to lower the subthreshold leakage current of the transistor, in many applications the required performance of the integrated circuit will not allow such an increase in the threshold voltage $V_T$.

There is a need for decreasing the subthreshold leakage current of MOS transistors forming an integrated circuit while at the same time allowing for high speed operation of such transistors.

SUMMARY OF THE INVENTION

An integrated circuit includes a substrate pump circuit developing an internal back-bias voltage on an output. An external terminal is adapted to receive an external back-bias voltage. A semiconductor substrate is coupled to the external terminal and to the output of the substrate pump circuit. The semiconductor substrate includes at least one transistor formed in the semiconductor substrate. The at least one transistor has a first threshold voltage when the internal back-bias voltage is applied to the semiconductor substrate, and a second threshold voltage greater than the first threshold voltage when the external back-bias voltage is received on the external terminal.

DETAILED DESCRIPTION OF THE INVENTION

Figure 1:
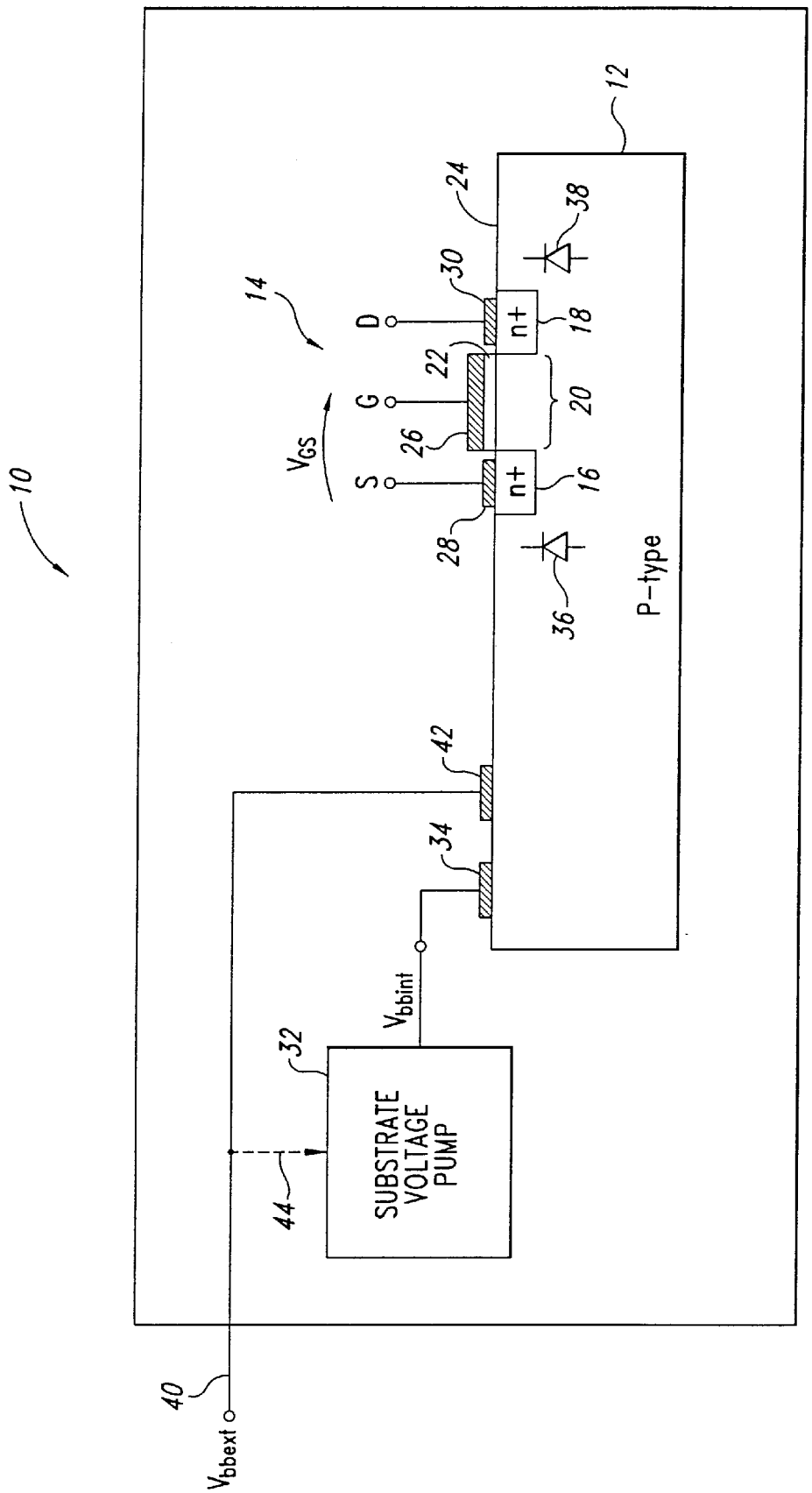
FIG. 1 is a block diagram of an integrated circuit formed according to one embodiment of the present invention.

FIG. 1 is a block diagram of an integrated circuit 10 according to one embodiment of the present invention. The integrated circuit 10 includes a semiconductor substrate 12 in which a number of MOS transistors 14 are formed, one of which is shown in FIG. 1. In the illustrated embodiment, the semiconductor substrate 12 is a p-type semiconductor. One skilled in the art will realize, however, that the present invention is equally applicable to integrated circuits formed in n-type semiconductor substrates. The MOS transistor 14 includes an n⁺ source region 16, and an n⁺ drain region 18 formed in the semiconductor substrate 12. The regions 16 and 18 may be formed through conventional process techniques, such as diffusion or ion implantation of a suitable dopant into the semiconductor substrate 12. The n⁺ source region 16 is spaced apart from the n⁺ drain region 18 and a channel 20 of the MOS transistor 14 defined between these two regions. An insulation layer 22 is formed above the channel region 20 on a surface 24 of the semiconductor substrate 12. Typically, the insulation layer 22 is an oxide, such as silicon dioxide, and is grown or otherwise deposited on the surface 24 using known process techniques. A conductive layer 26, such as a metal or polysilicon layer, is formed on the insulation layer 22 as shown, and forms the gate terminal of the transistor 14. In the same way, a conductive layer 28 is formed on the surface 24 above the source region 16 to form the source terminal of the MOS transistor 14, and a conductive layer 30 is formed above the drain region 18 to form the drain terminal of the MOS transistor 14. In operation, a current flows from the drain region 18 through the channel region 20 to the source region 16 when a sufficient voltage is applied to the gate terminal of the MOS transistor 14, as understood by one skilled in the art.

The integrated circuit 10 further includes a substrate voltage pump circuit 32 that develops an internal back-bias voltage $V_{bbint}$ which is applied through a conductive layer 34 to the semiconductor substrate 12. Although the pump circuit 32 is shown as separate from the substrate 12, the pump circuit is typically formed in the substrate. The design and operation of the substrate voltage pump circuit 32 is conventional, and for the sake of brevity will not be described in further detail. The internal back-bias voltage $V_{bbint}$ has a magnitude and polarity which reverse biases the source-substrate junction, represented by a diode 36, and drain-substrate junction, represented by a diode 38, during normal operation of the MOS transistor 14. For the MOS transistor 14, the back-bias voltage $V_{bbint}$ typically has a value of approximately −1.2 volts to allow the transistor to pass voltages from 0 volts to a supply voltage $V_{DD}$ on its source and drain terminals while maintaining the diodes 36 and 38 in a reverse bias condition.

The integrated circuit 10 further includes an external terminal 40 receiving an external back-bias voltage $V_{bbext}$ from an external circuit (not shown in FIG. 1). The terminal 40 is coupled through a conductive layer 42 to the semiconductor substrate 12. The external back-bias voltage $V_{bbext}$ has a greater magnitude and the same polarity as the internal back-bias voltage $V_{bbint}$. Thus, when the external back-bias voltage $V_{bbext}$ is applied to the substrate 12, a greater reverse bias voltage is applied across the source-substrate and drain-substrate junctions 36 and 38. For PMOS transistors formed in an n-type substrate or an n-well, the internal back-bias voltage $V_{bbint}$ may equal the supply voltage $V_{DD}$ and the external back-bias voltage $V_{bbext}$ then has a magnitude greater than $V_{DD}$.

The integrated circuit 10 operates in two modes, an active mode and a standby mode. During the active mode, no external back-bias voltage $V_{bbext}$ is applied on the terminal 40, and the transistors 14 operate such that the integrated circuit 10 performs its desired function. In the active mode, the substrate voltage pump circuit 32 applies the internal back-bias voltage $V_{bbint}$ to the substrate 12. As previously described, the threshold voltage $V_T$ of the transistor 14 is a function of the applied reverse bias voltage across the source-substrate junction 36. Thus, during the active mode, the transistor 14 has a first threshold voltage $V_{T1}$ defined by the internal back-bias voltage $V_{bbint}$.

In the standby mode of operation, the external circuit (not shown in FIG. 1) applies the external back-bias voltage $V_{bbext}$ on the terminal 40, and this voltage is coupled to the semiconductor substrate 12 through the conductive layer 42. When the external back-bias voltage $V_{bbext}$ is coupled to the semiconductor substrate 12, the reverse bias voltage across the source-substrate junction 36 equals the external back-bias voltage $V_{bbext}$, assuming the source of the transistor 14 is coupled to ground. The external circuitry applying the external back-bias voltage $V_{bbext}$ is capable of supplying a sufficient current to drive the substrate 12 to the external back-bias voltage $V_{bbext}$ even though the substrate voltage pump circuit 32 remains coupled to the substrate 12 and may simultaneously attempt to drive the substrate 12 to the internal back-bias voltage $V_{bbint}$. When the external back-bias voltage $V_{bbext}$ is coupled to the substrate 12, the source-substrate junction 36 is reverse biased by this external back-bias voltage and the transistor 14 has a threshold voltage $V_{T2}$ which is greater than $V_{T1}$. As previously described, the greater reverse bias voltage applied across the source-substrate junction 36 and corresponding increased threshold voltage $V_{T2}$ results in the transistor 14 having a lower subthreshold leakage current.

The operation of the integrated circuit 10 in the standby mode reduces the power consumed by the integrated circuit. When the integrated circuit 10 operates in the active mode, the transistors 14 have the threshold voltage $V_{T1}$ and operate as they would in a conventional integrated circuit to perform the designed function of the integrated circuit 10. In standby mode, however, the transistors 14 have the greater threshold voltage $V_{T2}$ which reduces the subthreshold leakage current of the transistors 14 and results in a corresponding decrease in power consumption by the integrated circuit 10. The standby mode of operation corresponds to a time when the integrated circuit 10 is not required to perform its designed function but remains coupled to its associated power supply. The integrated circuit 10 continues to draw power from the power supply in the standby mode, but the amount of power is significantly reduced by the reduced subthreshold leakage currents of the transistors 14.

In an alternative embodiment of the integrated circuit 10 of FIG. 1, the external back-bias voltage $V_{bbext}$ is also coupled directly to the substrate voltage pump circuit 32 as indicated by the dashed line 44. In this embodiment, the substrate voltage pump circuit 32 turns OFF when the external back-bias voltage $V_{bbext}$ is applied on the terminal 40. It should be noted that if the substrate voltage pump circuit 32 is not turned OFF, the pump circuit may draw additional current in trying to maintain the substrate 12 at the internal back-bias voltage $V_{bbint}$. In this situation, the additional current drawn by the pump circuit 32 may be greater than the total reduction of subthreshold leakage currents of the transistors 14, and the pump circuit 32 must be turned OFF to realize additional power savings.

Typically, the substrate voltage pump circuit 32 may include feedback circuitry operable to turn OFF the pump circuit when the internal back-bias voltage $V_{bbint}$ exceeds the desired value by a predetermined amount. For such a substrate voltage pump circuit 32, no direct connection between the pump circuit 32 and external back-bias voltage $V_{bbext}$ is required because the pump circuit turns OFF when the external back-bias voltage $V_{bbext}$ is applied to the substrates 12, further reducing the power consumption of the integrated circuit 10 in the standby mode.

Providing the external back-bias voltage $V_{bbext}$ from a circuit external of the integrated circuit 10 enables more efficient generation of the voltage $V_{bbext}$ than if the substrate voltage pump circuit 32 is used to generate this voltage. This is true because the pump circuit 32 typically consumes more current if operated to develop both the voltages $V_{bbint}$ and $V_{bbext}$ as understood by one skilled in the art. Thus, if the pump circuit 32 develops the voltage $V_{bbext}$ the reduced subthreshold leakage currents of the transistors 14 is offset by the increased current consumption of the pump circuit 32. In contrast, the present invention utilizes the voltage $V_{bbext}$ developed by an external circuit that may include more efficient circuitry for developing the voltage $V_{bbext}$. Furthermore, with the present invention a single external circuit can provide the voltage $V_{bbext}$ to a number of the integrated circuits 10, further reducing the overall power consumption of a system including a plurality of the integrated circuits 10. An external circuit operable to efficiently develop the voltage $V_{bbext}$ is conventional and thus, for the sake of brevity, will not be described in further detail.

Figure 2:
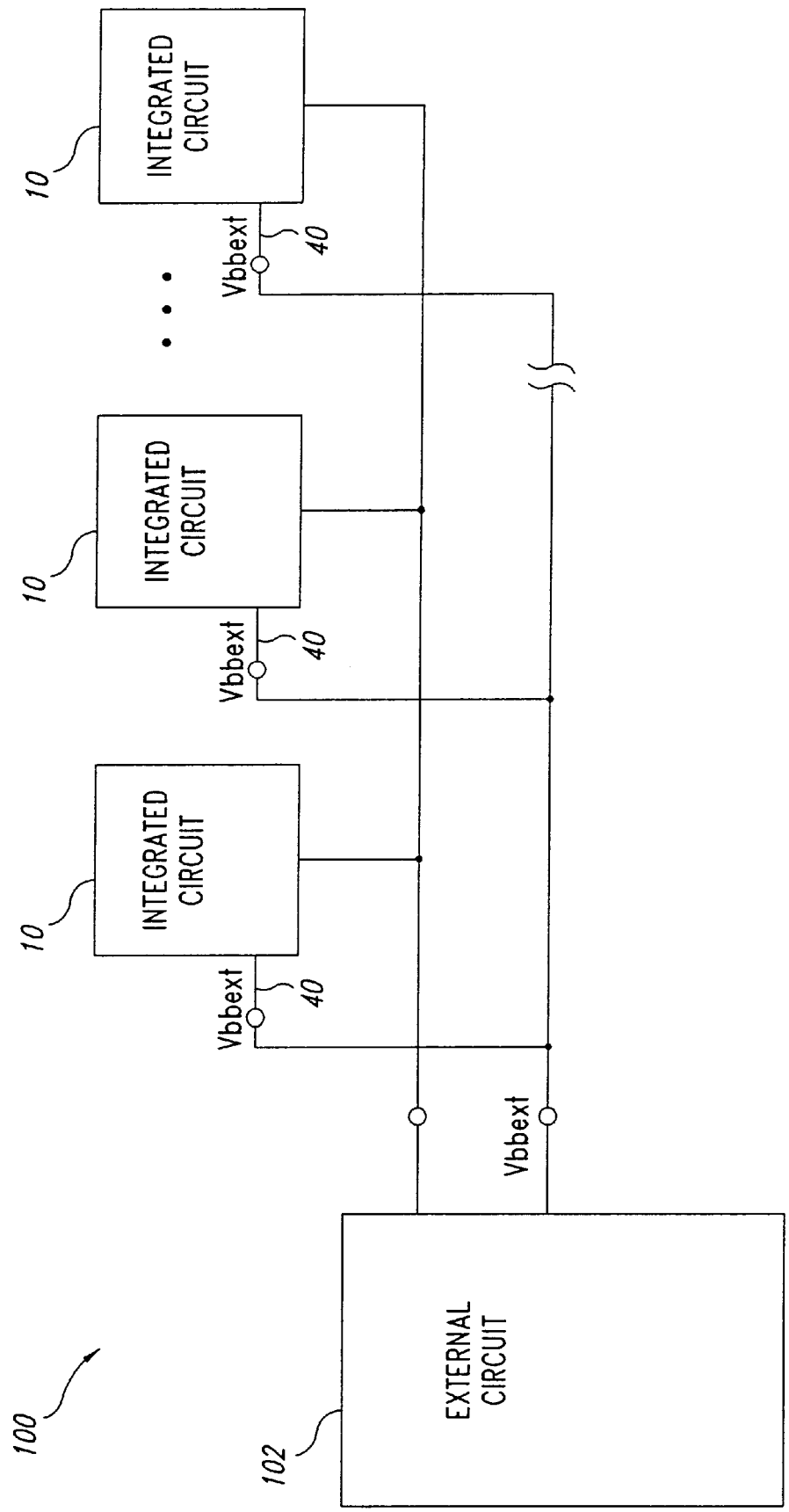
FIG. 2 is a block diagram of an electronic system including a number of the integrated circuits of FIG. 1.

FIG. 2 is a block diagram of an electronic system 100 including a number of the integrated circuits 10 of FIG. 1.

An external circuit 102 detects active and standby conditions of each of the integrated circuits 10 and controls the state of a signal applied on the terminals 40 of the integrated circuits 10 in response to the detected conditions. When the external circuit 102 detects any of the integrated circuits 10 in the active condition, the external circuit 102 presents a high impedance on each of the external terminals 40 placing all the integrated circuits 10 in the active mode and thereby causing the transistors 14 in each of the integrated circuits 10 to have the first threshold voltage $V_{T1}$. If the external circuit 102 detects all the integrated circuits 10 are in the standby condition, the external circuit 102 supplies the external back-bias voltage $V_{bbext}$ on the terminals 40 placing the integrated circuits 10 in the standby mode and thereby causing the transistors 14 to have the second threshold voltage $V_{T2}$. Depending on function of the integrated circuits 10, the external circuit 102 may detect active and standby conditions in many different ways as understood by one skilled in the art. For example, if the integrated circuits 10 are memory devices, the external circuit 10 may include transition detection circuitry coupled to an address bus of the memory devices. In such a system, a transition of a signal on any line of the address bus indicates at least one of the memory devices is in the active condition and the external circuit 102 presents a high impedance on the external terminals 40. No transition on any line of the address bus for a predetermined time indicates all of the memory devices are in the standby condition, and the external circuit 102 applies the external back-bias voltage $V_{bbext}$ on the terminals 40 to place the memory devices in the standby mode.

In another embodiment of the electronic system 100, the external circuit 102 provides separate outputs to each of the respective terminals 40. In this embodiment, the external circuit 102 detects active and standby conditions of each of the individual integrated circuits 10 enabling each integrated circuit 10 to be independently placed in the standby or active mode.

Figure 3:
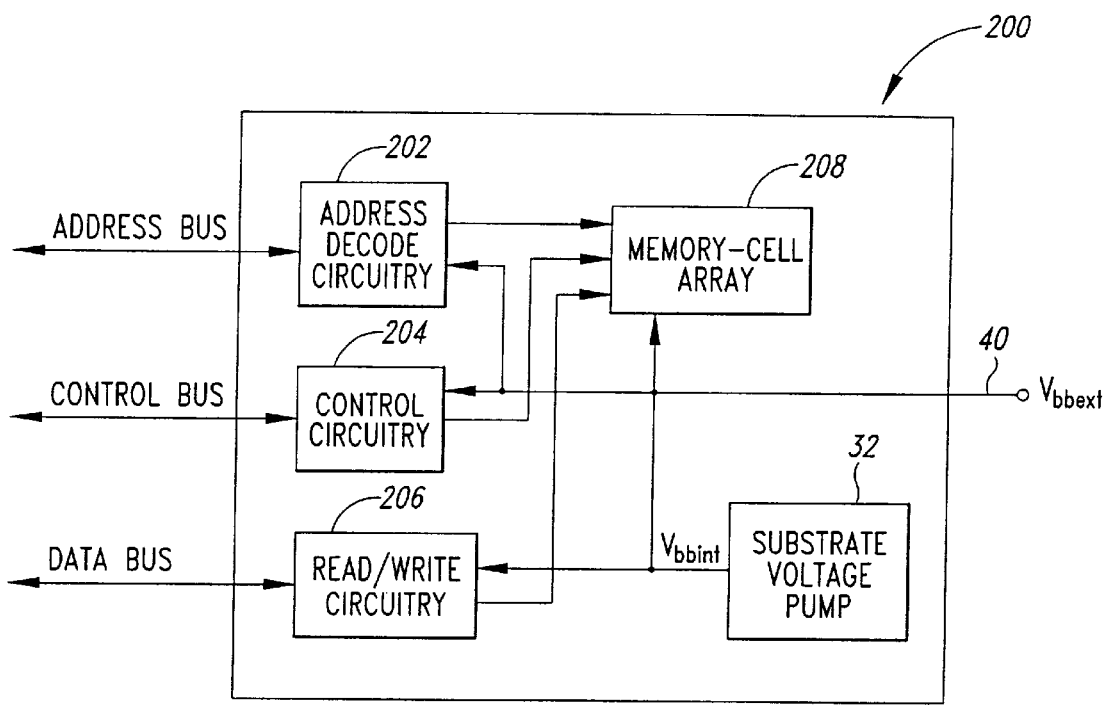
FIG. 3 is a block diagram of a semiconductor memory formed according to the present invention.

FIG. 3 is a block diagram of a memory device 200, such as a dynamic random access memory, including the external terminal 40 and substrate voltage pump circuit 32 of FIG. 1. The substrate voltage pump circuit 32 applies the back-bias voltage $V_{bbint}$ to address decode circuitry 202, control circuitry 204, read/write circuitry 206, and a memory cell array 208 formed in a semiconductor substrate (not shown in FIG. 3). The external terminal 40 is also connected to the elements 202–208 to apply the external back-bias voltage $V_{bbext}$ to these elements. More specifically, the external terminal is coupled to the semiconductor substrate in which these elements are formed. The address decode circuitry 202, control circuitry 204, read/write circuitry 206, and memory cell array 208 are all conventional and known in the art. The address decode circuitry 202, control circuitry 204, and read/write circuitry are all coupled to the memory cell array 208, and further coupled to an address bus, control bus, and data bus, respectively.

In operation, an external circuit, such as a memory controller or a processor, applies address, control, and data signals on the respective buses of the memory device 200. During a read cycle, the external circuit provides a memory address on the address bus and control signals on the control bus. In response to the address on the address bus, the address decode circuitry 202 provides a decoded memory address to the memory-cell array 208, and the control circuitry 204 provides control signals to the memory-cell array 208 in response to the control signals on the control bus. The control signals from the control circuitry 204 control the memory-cell array 208 so that the memory-cell array provides the addressed data to the read/write circuitry 206, which in turn outputs this data on the data bus for use by the external circuit. During a write cycle, the external circuitry provides a memory address on the address bus, control signals on the control bus, and data on the data bus. Once again, the address decode circuitry 202 decodes the memory address on the address bus and provides a decoded address to the memory-cell array 208. The read/write circuitry 206 provides the data on the data bus to the memory-cell array 208, and this data is stored in the addressed memory cells in the memory-cell array 208 under control of the control circuitry 204.

When the memory device 200 is active, which includes operation during read cycles, write cycles, and refresh cycles, the external circuit presents a high impedance on the terminal 40, and the internal back-bias voltage $V_{bbint}$ supplied by the substrate voltage pump circuit 32 determines the threshold voltages $V_{T1}$ of the transistors comprising the memory device 200. In standby mode, such as when the external circuit is not reading data from, writing data to, or refreshing data, the external circuit applies the external back-bias voltage $V_{bbext}$ on the terminal 40 to reduce the power consumption of the memory device 200 by lowering the subthreshold leakage currents of the transistors comprising the memory device as previously described. It should be noted that during standby, data stored in the memory device 200 still needs to be refreshed. Speed is not critical for data refresh when the memory device 200 is not active so the back-bias voltage could be maintained at the standby back-bias voltage $V_{bbext}$ during such a refresh.

Although FIG. 3 depicts the present invention in a memory device, many types of integrated currents may realize significant power savings from the present invention. For example, in a microprocessor the transistors are typically formed having minimum threshold voltages to decrease their switching time. As previously discussed, such minimum threshold voltages increase the subthreshold leakage currents of the transistors and the present invention may result in significant power reduction when the microprocessor, or portions of the microprocessor, are operating in standby mode.

Figure 4:
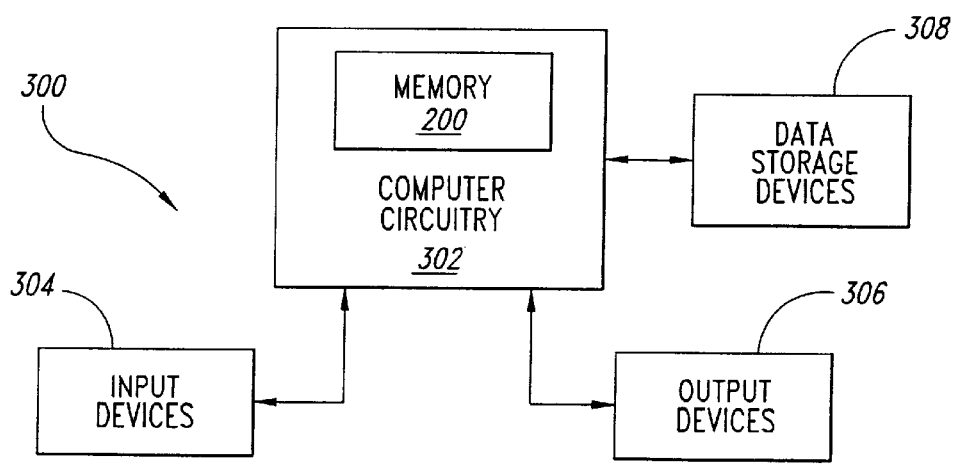
FIG. 4 is a block diagram of a computer system including the semiconductor memory of FIG. 3.

FIG. 4 is a block diagram of a computer system 300 which uses the memory device 200 of FIG. 3. The computer system 300 includes computer circuitry 302 for performing various computing functions, such as executing specific software to perform specific calculations or tasks. In addition, the computer system 300 includes one or more input devices 304, such as a keyboard or a mouse, coupled to the computer circuitry 302 to allow an operator to interface with the computer system. Typically, the computer system 300 also includes one or more output devices 306 coupled to the computer circuitry 302, such output devices typically being a printer or a video terminal. One or more data storage devices 308 are also typically coupled to the computer circuitry 302 to store data or retrieve data from external storage media (not shown). Examples of typical storage devices 308 include hard and floppy disks, tape cassettes, and compact disk read-only memories (CD-ROMs). The computer circuitry 302 is typically coupled to the memory device 200 through a control bus, a data bus, and an address bus to provide for writing data to and reading data from the memory device.

It is to be understood that even though various embodiments and advantages of the present invention have been set forth in the foregoing description, the above disclosure is illustrative only, and changes may be made in detail, and yet remain within the broad principles of the invention.

Therefore, the present invention is to be limited only by the appended claims.

What is claimed is:

1. A dynamic random access memory, comprising:
   an address bus;
   a control bus;
   a data bus;
   an address decoder coupled to the address bus;
   a control circuit coupled the control bus;
   a read/write circuit coupled to the data bus;
   a substrate pump circuit developing an internal back-bias voltage on an output;
   an external terminal adapted to receive an external back-bias voltage; and
   a semiconductor substrate in which the substrate pump circuit is formed, the semiconductor substrate being coupled to the external terminal and to the output of the substrate pump circuit, the semiconductor substrate including at least one transistor formed in the semiconductor substrate which has a first threshold voltage when the internal back-bias voltage is applied to the substrate, and a second threshold voltage greater than the first threshold voltage when the external back-bias voltage is received on the external terminal.

2. A microprocessor, comprising:
   a semiconductor substrate;
   computing circuitry including at least one transistor formed in the semiconductor substrate;
   a substrate pump circuit formed in the semiconductor substrate and having an output coupled to the semiconductor substrate, the substrate pump circuit developing on the output an internal back-bias voltage; and
   an external terminal of the microprocessor coupled to the semiconductor substrate, the external terminal adapted to receive an external back-bias voltage, and the at least one transistor having a first threshold voltage when the internal back-bias voltage is applied to the substrate, and a second threshold voltage greater than the first threshold voltage when the external back-bias voltage is received on the external terminal.

3. The microprocessor of claim 2 wherein substrate pump circuit is further coupled to the external terminal and operates in a first mode to develop the internal back-bias voltage when no external back-bias voltage is received on the external terminal, and operable in a second mode to turn off when the external back-bias voltage is received on the external terminal.

4. The microprocessor of claim 2 wherein the semiconductor substrate is a p-type semiconductor substrate.

5. The microprocessor of claim 2 wherein the internal back-bias voltage has a value of approximately −1.2 volts, and the external back-bias voltage has value less than −1.2 volts.

6. A computer system, comprising:
   a data input device;
   a data output device; and
   computing circuitry coupled to the data input and output devices, and coupled to an external terminal of a dynamic random access memory that includes,
   a substrate pump circuit developing an internal back-bias voltage on an output,
   the external terminal adapted to receive an external back-bias voltage from the computing circuitry, and
   a semiconductor substrate in which the substrate pump circuit is formed, the semiconductor substrate being coupled to the external terminal and to the output of the substrate pump circuit, the semiconductor substrate including at least one transistor formed in the semiconductor substrate which has a first threshold voltage when the internal back-bias voltage is applied to the substrate, and a second threshold voltage greater than the first threshold voltage when the external back-bias voltage is received on the external terminal.

7. A computer system, comprising:
   a data input device;
   a data output device;
   computing circuitry including,
   a substrate pump circuit developing an internal back-bias voltage on an output,
   an external terminal adapted to receive an external back-bias voltage, and
   a semiconductor substrate in which the substrate pump circuit is formed, the semiconductor substrate being coupled to the external terminal and to the output of the substrate pump circuit, the semiconductor substrate including at least one transistor formed in the semiconductor substrate which has a first threshold voltage when the internal back-bias voltage is applied to the substrate, and a second threshold voltage greater than the first threshold voltage when the external back-bias voltage is received on the external terminal; and
   a power supply circuit coupled to the external terminal which develops the external back-bias voltage, the power supply circuit applying the external back-bias voltage when the computing circuitry operates in a standby mode, and the power supply circuit applying no external back-bias voltage when the computing circuitry operates in an active mode.

* * * * *